United States Patent
Kanno et al.

(10) Patent No.: US 6,646,233 B2
(45) Date of Patent: Nov. 11, 2003

(54) WAFER STAGE FOR WAFER PROCESSING APPARATUS AND WAFER PROCESSING METHOD

(75) Inventors: Seiichiro Kanno, Chiyoda (JP); Ken Yoshioka, Hikari (JP); Ryoji Nishio, Kudamatsu (JP); Saburou Kanai, Hikari (JP); Hideki Kihara, Kudamatsu (JP); Koji Okuda, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/087,747

(22) Filed: Mar. 5, 2002

(65) Prior Publication Data

US 2003/0168439 A1 Sep. 11, 2003

(51) Int. Cl.$^7$ .................................................. F27B 5/14
(52) U.S. Cl. ........................ 219/390; 219/405; 219/411; 118/724; 118/725; 118/728; 392/416; 392/418
(58) Field of Search ................................. 219/390, 405, 219/411; 118/724, 725, 728, 50.1; 392/416, 418

(56) References Cited

U.S. PATENT DOCUMENTS

| | | | | |
|---|---|---|---|---|
| 5,709,757 A | * | 1/1998 | Hatano et al. | 134/22.14 |
| 5,835,334 A | * | 11/1998 | McMillin et al. | 361/234 |
| 5,851,298 A | * | 12/1998 | Ishii | 118/728 |

* cited by examiner

Primary Examiner—Teresa Walberg
Assistant Examiner—Shawntina T. Fuqua
(74) Attorney, Agent, or Firm—Antonelli, Terry, Stout & Kraus, LLP

(57) ABSTRACT

A wafer stage for use in wafer processing apparatus which comprises a liquid cooling jacket with a built-in coolant liquid circulation path and a ceramic plate that is attached onto the liquid cooling jacket and has therein a heater and an electrode for electrostatic chuck use, the wafer stage performing wafer processing while letting a wafer be mounted on the ceramic plate, wherein the liquid cooling jacket permits attachment of the ceramic plate through a coolant gas circulating gap as formed over the liquid cooling jacket while disposing between the liquid cooling jacket and the ceramic plate more than one heat resistant seal material containing therein an elastic body for sealing the coolant gas.

2 Claims, 16 Drawing Sheets

WAFER STAGE FOR WAFER PROCESSING APPARATUS AND WAFER PROCESSING METHOD

FIELD OF THE INVENTION

The present invention relates generally to wafer stage structures for use in wafer processing apparatus, and more particularly to a wafer stage suitable for processing at high temperatures (ranging from about 200 to 500° C.).

BACKGROUND OF THE INVENTION

In recent years, certain materials including but not limited to ruthenium and its oxides or platinum or the like are thought to be the top-rated candidates for the capacitor electrode material of semiconductor devices of the next generation, owing to congeniality with currently available capacitor dielectric films high in dielectric constant and the like. In addition, materials which are considered to be employable as gate dielectric films in place of silicon oxides may include zirconium oxides and hafnium oxides or else whereas PZT ($Pb(Zr,Ti)O_3$) and BST (($Ba,Sr)TiO_3$) are being considered for use as capacitor dielectric films. In this way, various kinds of "new" materials are under consideration for use as prospective semiconductor device materials. Unfortunately these new materials are thermally and chemically stable in nature and thus stay extremely low in volatility—in this respect, these are called non-volatile materials among experts in the semiconductor device art.

It is thus inevitable for performing etching treatment of these nonvolatile materials to maintain the temperature of a wafer being presently processed at high temperatures. Although in prior known etch processing apparatus or equipment it is a standard way that the wafer temperature is set to range from a low temperature of approximately -50° C. up to about 100° C., this temperature range is deemed insufficient in order to successfully etch the above nonvolatile materials due to the chemical stability thereof. Thus it is required that the nonvolatile materials be processed or micromachined within a high temperature range of from 200° C. to 500° C.

To realize a processing apparatus for processing wafers at such high temperatures, it is essential to employ a wafer stage capable of not only heating up wafers at high temperatures but also performing temperature control for establishment of a uniform wafer temperature distribution while increasing responsibility even in cases where heat input from a plasma is present.

A method for controlling the temperature of a wafer being processed with good responsibility is disclosed in Published Japanese Patent Application No. 7-176601 (JP-A-7-176601), wherein a gas gap space is provided between a pedestal for support of a wafer and its associative heat source and heat sink being provided thereunder for controlling the pressure of a gas being introduced into this gas gap space to thereby control the wafer temperature.

Another approach is disclosed in JP-A-2001-110885, wherein a heat transfer gas chamber capable of sealing and exhausting gases is provided between a support member for holding a wafer and a cooling member for performing cooling while further providing a heating element(s) on the support member side to thereby maintain the wafer at a high temperature.

SUMMARY OF THE INVENTION

With the example taught from the above-identified Japanese document JP-A-7-176601, in order to seal a gas in a gap space as provided between the pedestal for support of a wafer and the heat sink, the pedestal and heat sink are welded together; or alternatively, these are fixed with an O-ring interposed therebetween. In case the pedestal and heat sink are fixed together by welding techniques, whenever the wafer-supporting pedestal is replaced with a new one due to its lifetime or accidental failures or the like, a replacement range tends to become wider resulting in an increase in complexity of works required therefor. Additionally the connection due to welding suffers from a limitation to usable materials—that is, both the pedestal and the heat sink are strictly required to be made of metals only. Alternatively in the case of fixation using the O-ring interposed, a usable temperature range is limited by the heat resistance temperature of such O-ring so that its upper limit stays merely at 200° C., or more or less.

The example found in JP-A-2001-110885 is similar to that of JP-A-176601 in that it discloses therein a method for welding together a support member for support of a wafer and a cooling member or alternatively clamping them together using bolts with an O-ring sandwiched therebetween, wherein this approach suffers from similar problems to those stated supra.

Additionally with this example, a method for improving a wafer in-plane temperature distribution is shown, wherein, for the purpose of improving the uniformity of a wafer temperature in the area of a wafer surface, a region with a variable height is provided within the region of a recess portion as provided in a cooling member causing thermal conductance between the cooling member and support member to have a distribution, thereby to improve the wafer in-plane temperature distribution. However, with such an arrangement, in the event that a cooling member structure capable of realizing an optimized temperature distribution is employed in the case of a certain use temperature, the wafer in-plane temperature distribution can often vary at other use temperatures. This phenomenon poses a serious problem in particular in the case of usage at a high temperature of 400° C. or 500° C. This can be said because heat release or "escape" of via radiation from the wafer stage relatively increases in the temperature region of 400° C. or 500° C. and thus serves as the cause of deterioration of the wafer in-plan temperature distribution. Inherently it is desirable that the temperature distribution of the wafer stage be kept uniform in a wide temperature range. To this end, it is advantageous that such heat release from the wafer stage is less whereas heat delivery between it and the cooling member stays uniform in the plane. However, in this example, no teachings are found as to methodology for suppressing the heat release from the wafer stage. The present invention was made in view of these problems to provide a wafer stage capable of uniformly maintaining the temperature distribution of a wafer at high temperatures within a wide temperature range. The invention also provides a wafer processing method with virtually no risks of giving obstruction to the wafer due to a temperature change during wafer processing using the wafer stage.

To solve the foregoing problems the present invention employs the following means.

In a wafer stage suitable for use in a wafer processing apparatus which comprises a liquid cooling jacket with a built-in coolant fluid circulation path and a ceramic plate that has therein a heater and an electrode for electrostatic chuck use and is attached to overlie the liquid cooling jacket and which is operable to perform wafer processing while letting the wafer be mounted on the ceramic plate, the liquid cooling jacket is arranged so that the ceramic plate is attached through a coolant gas circulating gap as formed on or above the liquid cooling jacket while letting heat-resistant seal materials be disposed between the liquid cooling jacket and the ceramic plate, the seal materials containing therein an elastic or resilient body or bodies for sealing the coolant gas. The ceramic plate is attached to the liquid cooling jacket by more than one adhesive clamping element made of zirconia ceramic material in accordance with a feature of the present invention, and any one of the heater and the electrode for electrostatic chuck includes a cylindrical plug as built in the ceramic plate and a stem-like terminal with a spring member insertable into the cylindrical member being engaged therewith, in accordance with another feature of the present invention.

Other objects, features and advantages of the invention will become apparent from the following description of the embodiments of the invention taken in conjunction with the accompanying drawings.

BRIEF DESCRIPTION OF THE DRAWINGS

FIGS. 5A–5B are diagrams each showing an enlarged view of an internal electrode.

DETAILED DESCRIPTION OF THE EMBODIMENTS

Figure 1:
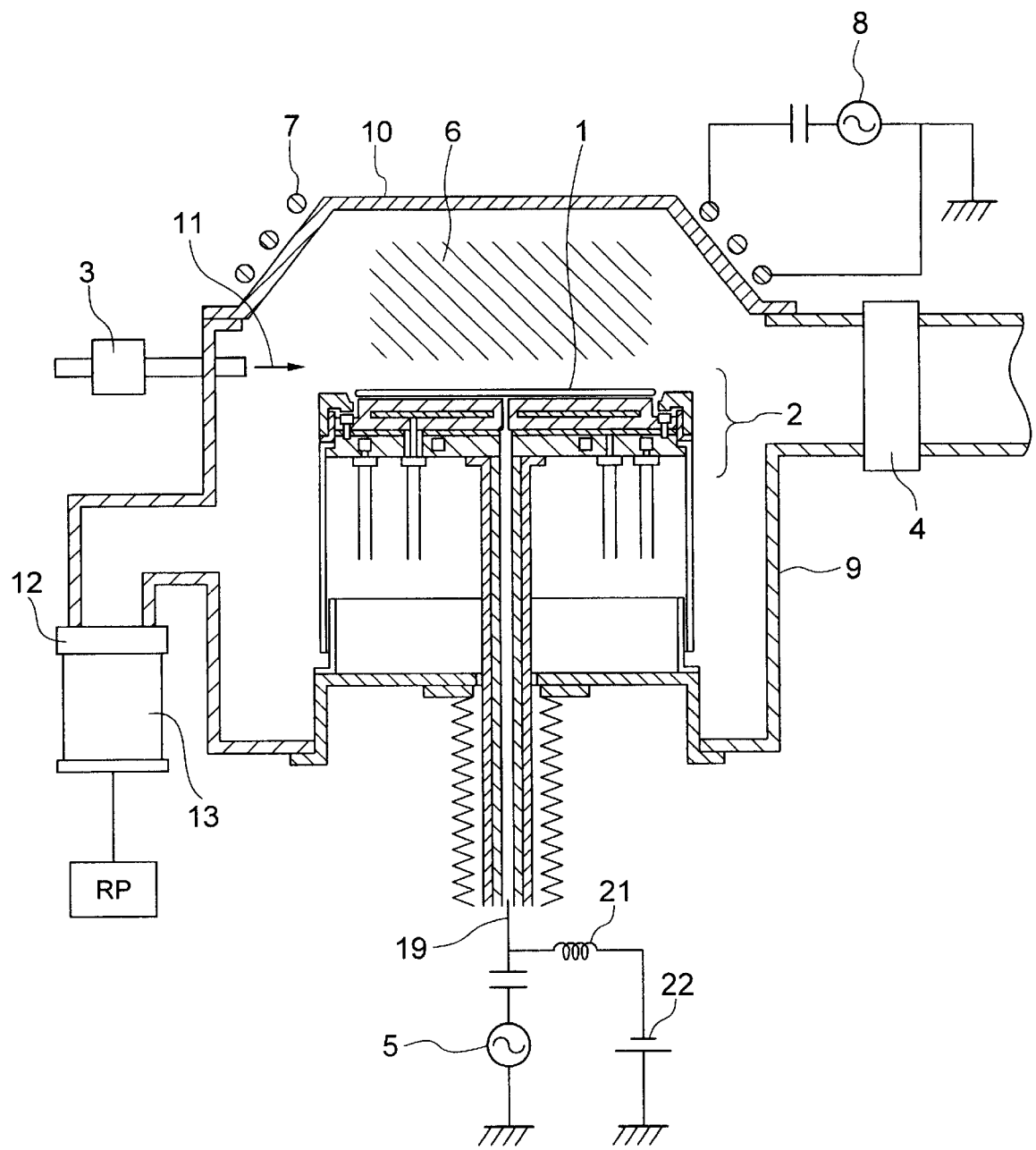
FIG. 1 is a diagram showing a first embodiment of the present invention.
Figure 2:
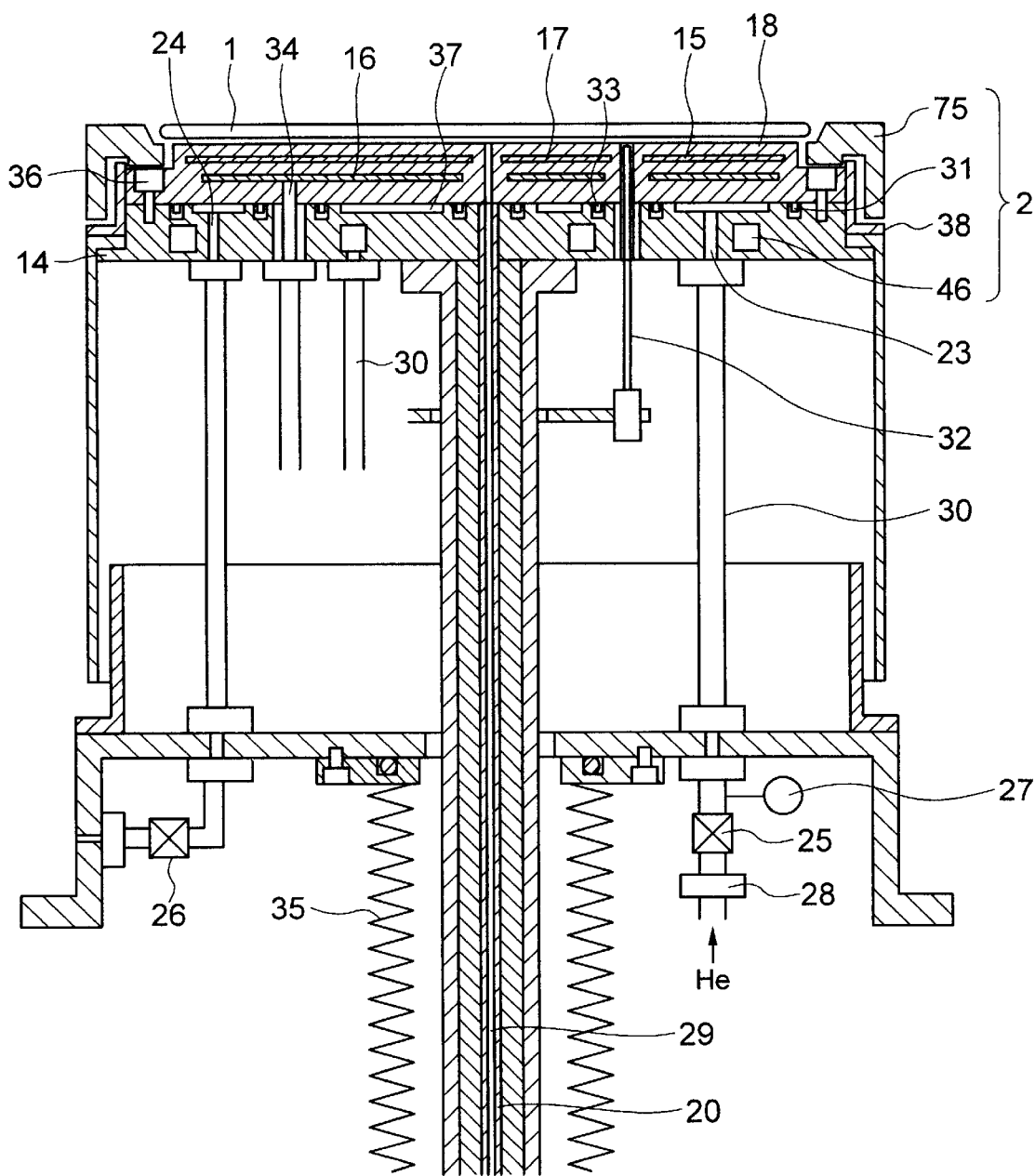
FIG. 2 is a diagram depicting an enlarged view of a wafer stage shown in FIG. 1.
Figure 3:
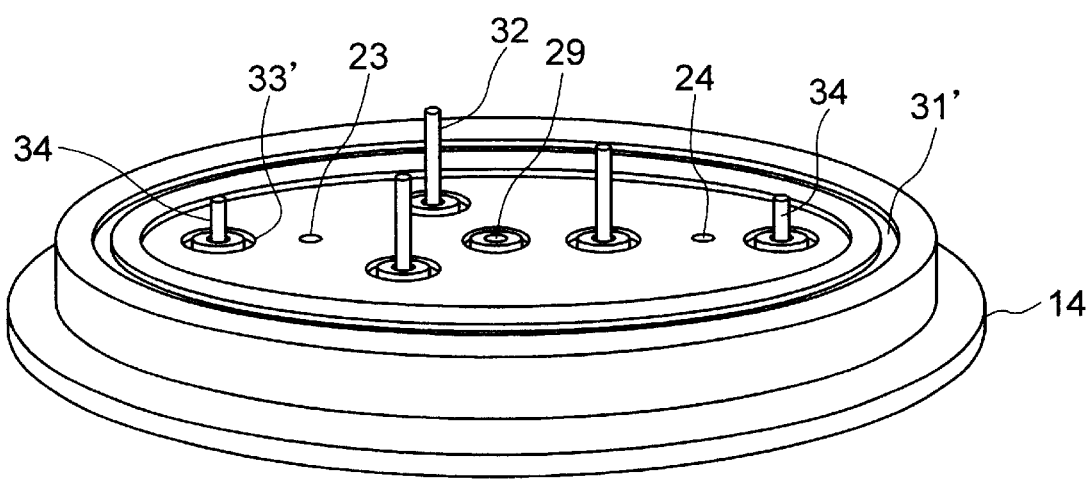
FIG. 3 is a diagram showing a perspective view of a water-cooling jacket.

Preferred embodiments of the present invention will be explained with reference to the accompanying drawings below. A first embodiment of this invention is shown in FIGS. 1 and 2. FIG. 1 depicts an example wherein a wafer stage of the invention is applied to a plasma processing apparatus; FIG. 2 shows an enlarged view of the wafer stage shown in FIG. 1; and, FIG. 3 is a perspective view of a water-cooling jacket.

As shown in FIG. 1, an etching gas 11 is introduced into the interior space of a vacuum chamber 9 while maintaining the chamber interior at an appropriate pressure by open-degree adjustment of a valve 12 that is installed in the upstream of a turbo molecular pump 13. A bell jar 10 made of alumina is stacked at upper part of the vacuum chamber 9, with a coil 7 mounted around this bell jar. The coil 7 is connected to a high-frequency power supply 8 for application of a high-frequency voltage, e.g. high-frequency voltage of 13.56 MHz, to both ends of the coil to thereby create an inductively coupled plasma (ICP) 6. Etch processing is carried out by exposing a wafer 1 to this plasma. During processing, the wafer is stably mounted on a wafer stage 2 while being under temperature management.

Additionally, in order to apply a bias voltage to the wafer, a high-frequency power supply 5 is connected to the wafer stage. In addition, a DC power supply 22 is connected to a power feed line of this high-frequency power supply for adding electrostatic chuck functionality to the wafer stage. Note that in the drawing, reference numeral "3" designates a flow rate controller for control of the flow rate of an etching gas whereas numeral 4 denotes a gate valve. The gate valve 4 is set in the open state while the wafer is being transported, thereby permitting a transport arm (not shown) for wafer transportation to move forward or backward through the gate valve 4.

A detailed explanation will next be given of the wafer stage embodying the instant invention with reference to FIGS. 2 and 3. The wafer stage 2 is generally structured from a water-cooling jacket 14 for cooling use and a ceramics plate 15 which has a heater function and electrostatic chuck function, wherein the plate is rigidly mounted on the jacket 14 by bolt clamp techniques.

The ceramics plate 15 is typically made of aluminum nitride that is large in thermal conductivity, with a heater 16 embedded therein. Thus, supplying power to the heater 16 makes it possible to heat up the ceramics plate. It should be noted here that the ceramics plate is made of aluminum nitride because the aluminum nitride is inherently high in thermal conductivity without risks of creation of any appreciable in-plane temperature differences, which in turn makes it possible to make uniform or "uniformize" the resultant wafer temperature distribution. It would readily occur to those skilled in the art that the plate may alternatively be made of other similar suitable materials in place of the aluminum nitride when the need arises.

Additionally an internal electrode 17 is provided and embedded to overlie the heater 16 within the ceramics plate 15, for giving the intended electrostatic chuck function and RF bias to the wafer stage. When applying a DC voltage to this internal electrode 17, a potential difference generates between the internal electrode 17 and the wafer 1 (this wafer is being exposed to the plasma and is thus kept substantially at ground potential), causing electrical charge to be accumulated or stored between the internal electrode and the wafer's back surface to thereby allow the wafer to be sucked and fixed by Coulomb force to the ceramics plate. In addition to the DC voltage, a high-frequency voltage is also applied to the internal electrode 17, which voltage is for supplying bias power to the wafer. It is the high-frequency power supply 5 of FIG. 1 that performs this task.

An electric circuit is such that the DC power supply 22 for electrostatic chuck use is connected via a coil 21 to an electrical power supply or "feed" line 19. In the illustrative embodiment, it is a hollow shaft 20 that corresponds to the power feed line, wherein the hollow shaft is provided within a support member. When applying a high-frequency voltage to the internal electrode 17 through this hollow shaft while applying a bias voltage to the wafer, it is possible to effectively attract ions in the plasma toward the wafer. Whereby, effects are expectable including, but not limited to, an increase in etching rate and further improvements in etching shape.

Figure 4A:
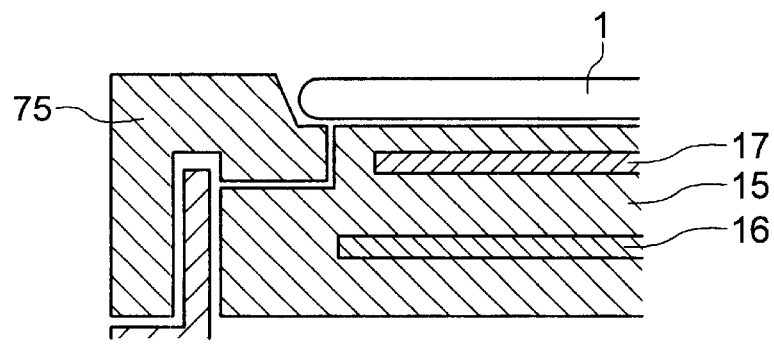
FIGS. 4A and 5B are diagrams each showing an enlarged view of an internal electrode.
Figure 4B:
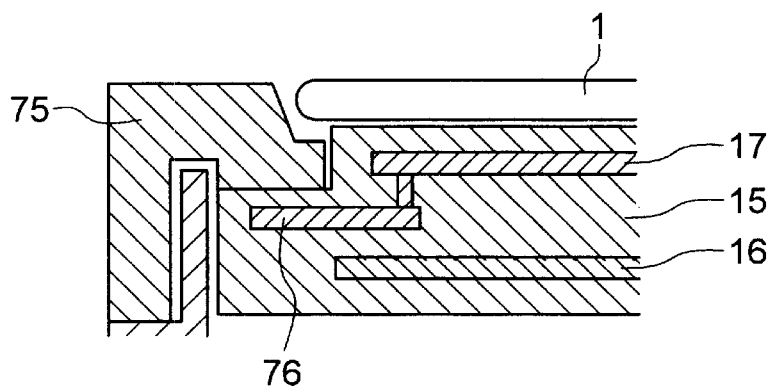

An explanation will be given in view of the fact that the obtainable effects are different depending upon layout settings of the heater 16 and the internal electrode 17. An enlarged view of the layout of an internal electrode 17 similar to the first embodiment is shown in FIG. 4A. In the case of this example the internal electrode 17 is disposed only within a convex portion or protrusion of the ceramics plate 15; thus, only the wafer is attracted with the RF bias also being applied only to the wafer. In brief, a susceptor 75 is hardly electrostatically attracted without application of any RF bias. Accordingly the susceptor 75 will no longer be subjected to plasma etching. In contrast thereto, in the case of an example of FIG. 4B, a second internal electrode 76 is built therein, which is electrically connected to the ceramics plate's internal electrode 17. With this scheme, not only the wafer but the susceptor 75 is electrostatically attracted while permitting RF bias to be applied also to the susceptor 75. To be brief, this scheme provides a method advantageous to etching processes that are strong in deposition properties or characteristics. More specifically in the case of such deposition property-enhanced processes, with the scheme of FIG. 4A, deposited materials (sediments) can attach to the susceptor and then these deposits attached behave to peel off to reside on the wafer surface as contaminants in some cases, which in turn causes reduction of production yields. In contrast, in the case of the FIG. 4B example, any deposits being attached to the susceptor may be etched away by application of an RF bias thereto, resulting in a decrease in residual contaminants on the wafer surface; thus, there is an advantage that the yield increases.

Figure 5A:
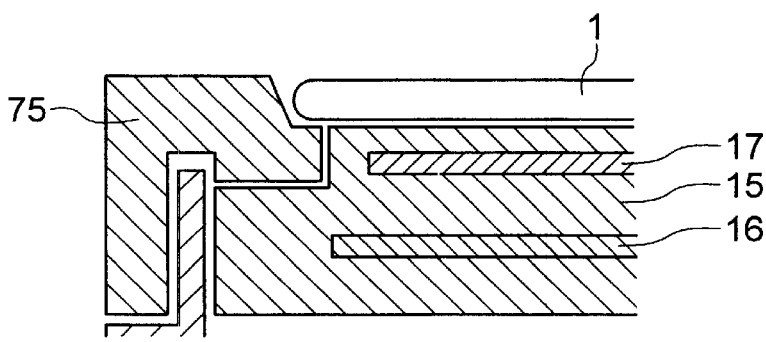
Figure 5B:
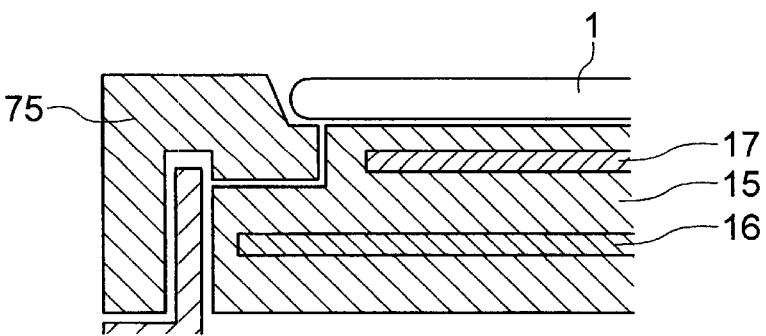

An explanation will next be given of a difference of effects occurring due to a difference in heater's outer diameter in conjunction with FIGS. 5A–5B. FIG. 5A shows a case where the heater 16 is disposed so that its outer diameter is substantially the same as that of the protrusion of the ceramics plate in a similar way to that of the first embodiment. In this case, such arrangement is effective as a scheme for equalizing or uniformizing a wafer temperature distribution in the event that the amount of heat input from a plasma is large. More specifically, in case the outer diameter of a heater of FIG. 5B is made larger than the ceramics plate's protrusion to an extent that it extends and reaches a nearby portion of the outer diameter of ceramics plate, it is possible to uniformly heat up almost the entire surface area of the ceramics plate; thus, there is a merit that the wafer temperature distribution is readily made uniform in the event that there is no plasma heat input or alternatively such heat input stays less. However, in case the plasma heat input is significant, a need is felt to force the ceramics plate to decrease in temperature; due to this, it is necessary to lessen an output toward the heater. In this case the input heat amount of the protrusion becomes relatively larger than the input heat amount at or near the outer periphery. This would result in a relative decrease in wafer outer periphery temperature, which leads to creation of a temperature distribution within the wafer surface concerned.

By contrast, in the case of FIG. 5A, the heater is substantially the same in range as the protrusion region with a wafer temperature distribution being made uniform by this heater layout whereby an input heat distribution of only the same region as its original state is obtainable even in cases where the plasma input heat stays large and the heater output decreases so that the resulting wafer temperature distribution will no longer be deteriorated.

It should be noted that with regard to the structure of the aforesaid internal electrode and the heater's outer diameter, these may be optimized on a case-by-case basis in accordance with conditions for actual implementation. Also note that the present invention should not be interpreted to restrict the way of employing them in either one of the combinations.

It is apparent that from the above discussion when applying a bias voltage to the internal electrode to thereby process the wafer of interest, this wafer increases in temperature due to heat input from a plasma. Although such temperature increase poses no specific problems as far as the input heat amount stays less, failure to perform precise wafer temperature control management in standard or ordinary semiconductor fabrication processes can result in deterioration of resultant etching characteristics. As stated previously, in order to maintain the wafer's temperature at high temperatures, it is necessary both to heat up the ceramics plate by the heater in the absence of any appreciable heat input from the plasma, and to remove the incident heat energy to the wafer when the processing gets started and there is certain heat input from the plasma. As a remedy for this, with this embodiment, as shown in FIG. 2, a gap 18 of 0.5 mm is provided between the ceramics plate 15 and the water-cooling jacket 14 with a helium gas with a pressure of 1 kPa or below being introduced into this gap. Numeral 23 indicates a helium gas introduction or "inlet" port whereas 24 is a helium gas exhaust or "outlet" port. To be brief, when it is required to maintain the wafer at high temperatures in the absence of any heat input from the plasma, close a valve 25 while opening a valve 26 to thereby let a pressure within the gap be the same as that of the processing chamber (customarily set at about several Pa or less), thus establishing vacuum thermal insulation. Alternatively when a need arises to cool down the ceramics plate due to heat input from the plasma, open the valve 25 and simultaneously close the valve 26 for introduction of a helium gas into the gap to thereby provide a heat transfer from the ceramics plate toward the water cooling jacket, thus performing cooling. In such case, the helium gas residing within the gap is set at an appropriate level in such a way that a pressure gauge 27 is provided in the downstream of the valve 25 while controlling an operation of a flow rate controller 28.

Additionally since the pressure of the processing chamber for processing the wafer is set at about several Pa or below as described above, it is also required to introduce a heat transfer gas such as helium gas into a space between the wafer back surface and the ceramics plate. In this embodiment the gas is supplied through the hollow shaft as built in a support member for applying both a high-frequency voltage and DC voltage to the internal electrode. In brief, it is arranged so that the required helium gas is introduced onto the wafer back surface from a through-going hole 29 which is provided at a central portion of the ceramics plate.

A groove 46 is provided in the interior of the water cooling jacket for forcing water to circulate therealong for cooling purposes. In this embodiment the cooling water as used therein is coolant water that is provided within a clean room. Flowing the coolant water into the groove and water drainage are done by use of more than one flexible pipe (not shown). Piping between the valve 25 and the helium gas inlet port 23 employs a flexible pipe 30. With such an arrangement, it is possible to accommodate upward and downward movements of an entirety of the wafer stage 2. Note here that the coolant water inlet port alone is depicted in the drawing with its associated return side eliminated from the illustration. Also note that although in this embodiment water is used as the refrigerant, this should not be limited only to water. Other similar suitable coolants are usable, which include but not limited to flon-based (fluorine-based) refrigeration media such as Florinert and Galden (both are trade names). Note however that in the case of using water, in view of the fact that a heat transfer coefficient between a component for letting the refrigerant circulate (in this example, the water cooling jacket) and refrigeration media is significant, there is a merit that an increased heat transfer amount is made available between it and the ceramics plate in case a helium gas pressure of the gap 18 is kept unchanged. This may be reworded in a way such that the pressure required to provide the same heat transfer amount is lowered. In summary, the helium's seal conditions are loosened or "relaxed" in terms of apparatus designs; thus, this becomes a great merit.

Wafer transportation may be done by a process including the steps of letting the wafer stage 2 move upward and downward owing to expansion and shrink operations of bellows 35 due to up/down mechanisms (not shown) and then peeling off the wafer from the ceramic plate by using a pusher pin 32 that is fixed.

An explanation will next be given of a remedy that is a principal feature of the present invention, which is for control of a wafer temperature over a wide temperature range covering up to a high temperature of about 500° C. while at the same time increasing responsibility and also achieving a uniform distribution.

As in the illustrative embodiment, in case a helium gas is introduced into the space between the ceramics plate and the water cooling jacket, it becomes an important technical issue to suppress any possible leakage of the helium gas. With this embodiment, in order to make it possible to use the wafer stage up to a high temperature region of about 500° C., one or more metallic seals each internally holding a coil spring are employed rather than O-rings as used in the prior art. For example in FIGS. 2 and 3, reference numerals 31 and 31' designate a seal and a seal engagement/insert groove for prevention of leakage from the outer periphery of the water cooling jacket 14 toward the processing chamber. In addition, a seal 33 that is less in diameter and has a similar function and its associative seal insert groove are used around the pusher pin 32 that is for peeling off a wafer out of the stage and then transport it. Additionally provided around a heater power feed unit 34 and a sheath thermocouple (not depicted in FIGS. 1–2 and will be discussed later) for measurement of a temperature of the ceramics plate are seals each having an appropriate diameter matching the size of its corresponding one of respective components along with seal insert grooves associated therewith, thereby precluding any possible helium gas leakage. In the case of using such seals of this embodiment, unlike O-rings, it is possible to attain sufficient utilization up to a high temperature of 500° C. or more or less. Additionally, when compared to the case of mere metal seals, several effects and advantages are expectable, including a decrease in clamping torque due to the elastic action of the internal coil spring, an increase in tracking continuity of seal effects even when a positional relationship of those members for sealing based on thermal expansion varies slightly, or an ability to achieve the repeated usability. It is also noted that although in this embodiment the spring as provided within the metal seal is a coil spring, this may be replaced by a plate spring or the like. Importance lies in that the seal is a member which has elasticity as internally held therein and which exhibits deformability.

The next remedy taken therein is to uniformize a temperature distribution of the ceramics plate in order to uniform a wafer temperature distribution. To do this, a unique remedy is employed for suppressing heat conduction through a bolt(s) for fixing the ceramics plate to the water cooling jacket and outward heat release from the ceramics plate to the water cooling jacket or from the side wall of the ceramics plate to the vacuum chamber by radiation.

One example is that with the present invention bolts 36 made of zirconia ceramics are used to lower local heat release or "runaway" occurring due to thermal conduction through the bolt(s) for fixing the ceramics plate to the water cooling jacket 14. The zirconia ceramics is very low in thermal conductivity to an extent that the heat conductivity is as small as about 3 W/mK and yet significant in value of robustness against destruction to thereby exhibit excellent features as to mechanical strength. Thus this material is suitable for use as the material of bolts for fixation of the ceramics plate.

It should be also noted that this embodiment comes with a specific design for enlarging the diameter of a bolt hole as provided in the ceramics plate to an extent that permits thermal expansion of the ceramics plate to thereby ensure that any ceramics screw will no longer be broken even in cases where the ceramics plate is heated up to a high temperature of about 500° C. This will be explained in detail using a practical example thereof. In this embodiment the zirconia bolt is a M4 screw, which is designed to be fixed at a position with a radius of 110 mm. In the event that the ceramic plate is heated from a room temperature of 20° C. up to 500° C., the resulting expansion due to heat in a radial direction is expected to measure $(500-20) \times 5 \times 10^{-6} \times 110 = 0.26$ mm in view of the fact that the expansion coefficient of zirconia is $5 \times 10^{-6}$ (1/K). Thus it is required that a marginal allowance of 0.26 mm on one side be given in minimum: in this case, it becomes 4.52 mm. However, it is actually set at $\phi 5$ with an assembly allowance added thereto.

Next, for the purpose of preventing outward heat release via radiation from the ceramics plate, the water cooling jacket has its surface 37 with mirror polishing or grinding treatment applied thereto. Now estimate the heat release in case the water cooling jacket's surface is subjected to the mirror polishing along with that in case of no such polishing. In this embodiment the ceramics plate was 240 mm in diameter. Thermal emissivity on the surface of the ceramics plate measures 0.8 whereas thermal emissivity on a surface of the water cooling jacket is 0.3 in the state that it was not subject to any mirror polishing and 0.1 in the state that it experienced the mirror polishing. Measurement of the thermal emissivity is executable by direct methods for measuring the thermal emissivity while heating up a specimen or alternatively by indirect methods for calculation based on a spectral reflection factor as obtained through measurement of reflection spectrum using a FT-IR (Fourier transform infrared spectrometer). The water cooling jacket is cooled down and is kept at 30° C., wherein in case the ceramics plate's temperature is held at 500° C., an increased amount of heat as large as about 250 W will be expelled in the case of no polishing. In contrast, in case the mirror polishing is done, it is lowered to an extent equal to about 90 W, which is roughly ⅓ of the former.

Next, in order to lower heat release from the outer periphery of the ceramics plate, this embodiment is arranged to provide a radiant heat insulating material 38 with chromium plating applied to its surface in such a manner as to surround the ceramics plate. Now let's estimate an effect of the above-stated radiant heat insulation material. In this embodiment the ceramics plate was 20 mm in thickness. While in the absence of any radiant heat insulation material a relatively large amount of radiant heat of approximately 80 W is expelled toward the inner wall (with its thermal emissivity assumed to measure 0.3) of a vacuum chamber with its temperature kept at about a room temperature (assume it to be 25° C.), the same is reduced to measure about 30 W in the presence of the radiant heat insulation material (assume the thermal emissivity on its surface to be 0.1), wherein the latter value is less than half of the former.

It must be noted that although in this embodiment a specific structure is employed wherein the water cooling jacket's upper surface is mirror-polished whereas the radiant heat insulation material is chromium-plated on the surface thereof, such combination will not necessarily be employed in every case. Both of them may be subject to chromium-plating treatment or alternatively to mirror-polishing. Also note that although no specific micromachining is applied to the surface of the ceramics plate, it will also possible that a surface on this side is also coated with certain material which serves to reduce the thermal emissivity thereon. Further note that although in this embodiment chromium plating is applied as the plating treatment, this invention should be limited only thereto and other similar suitable materials are alternatively employable, such as for example nickel or copper or else. Furthermore, although in this embodiment the radiant heat insulation material consists of a single one at the outer periphery of the ceramic plate, the invention should not exclusively be limited thereto: if a structure is used with a plurality of ones stacked over one another, then the resultant heat insulation effect may be further enhanced, which in turn makes it possible to expect an effect of further uniformizing a temperature distribution in close proximity to the outer periphery of the ceramic plate.

Figure 6:
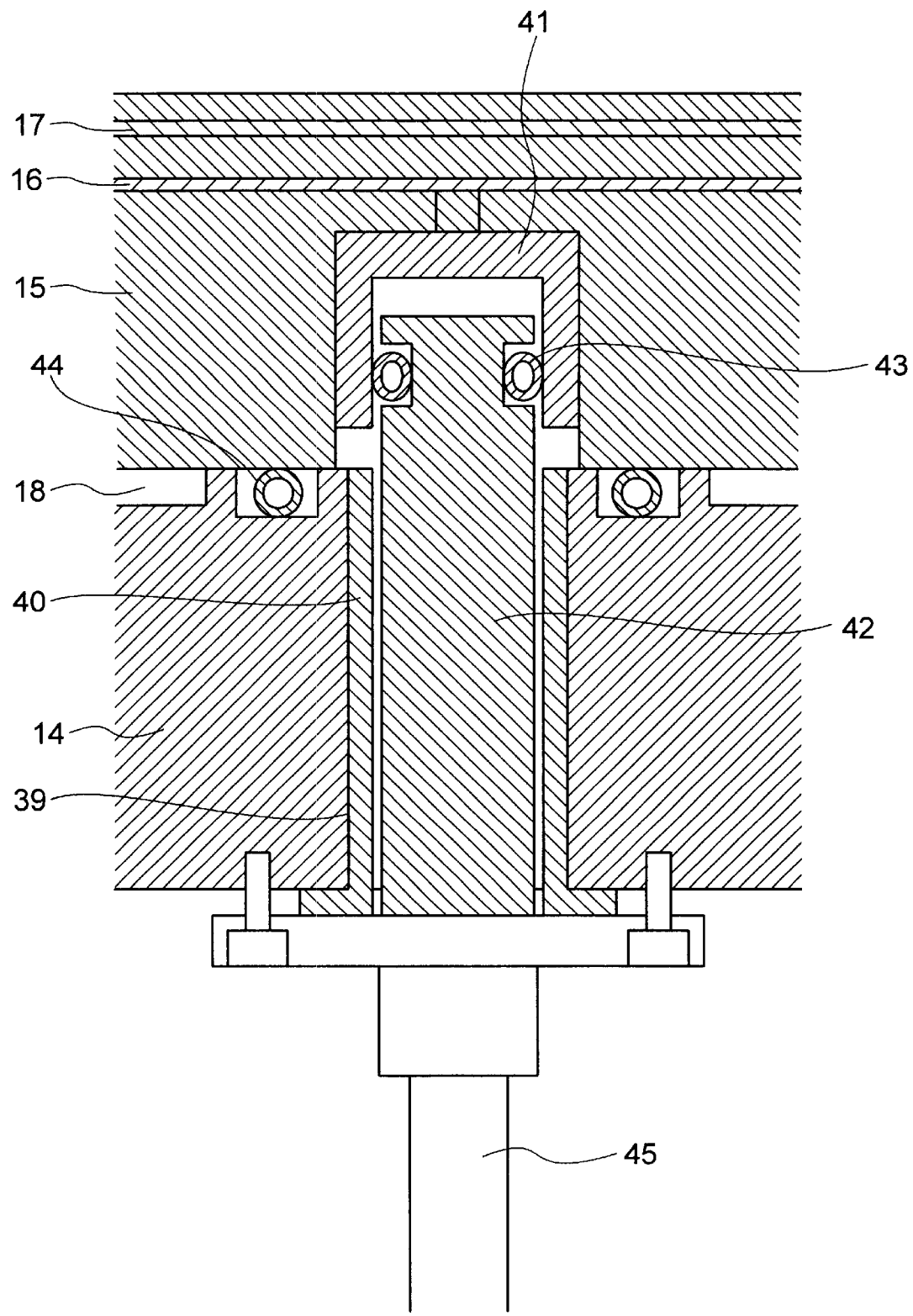
FIG. 6 is a diagram for explanation of the structure of a module for supplying electrical power to a heater.
Figure 7:
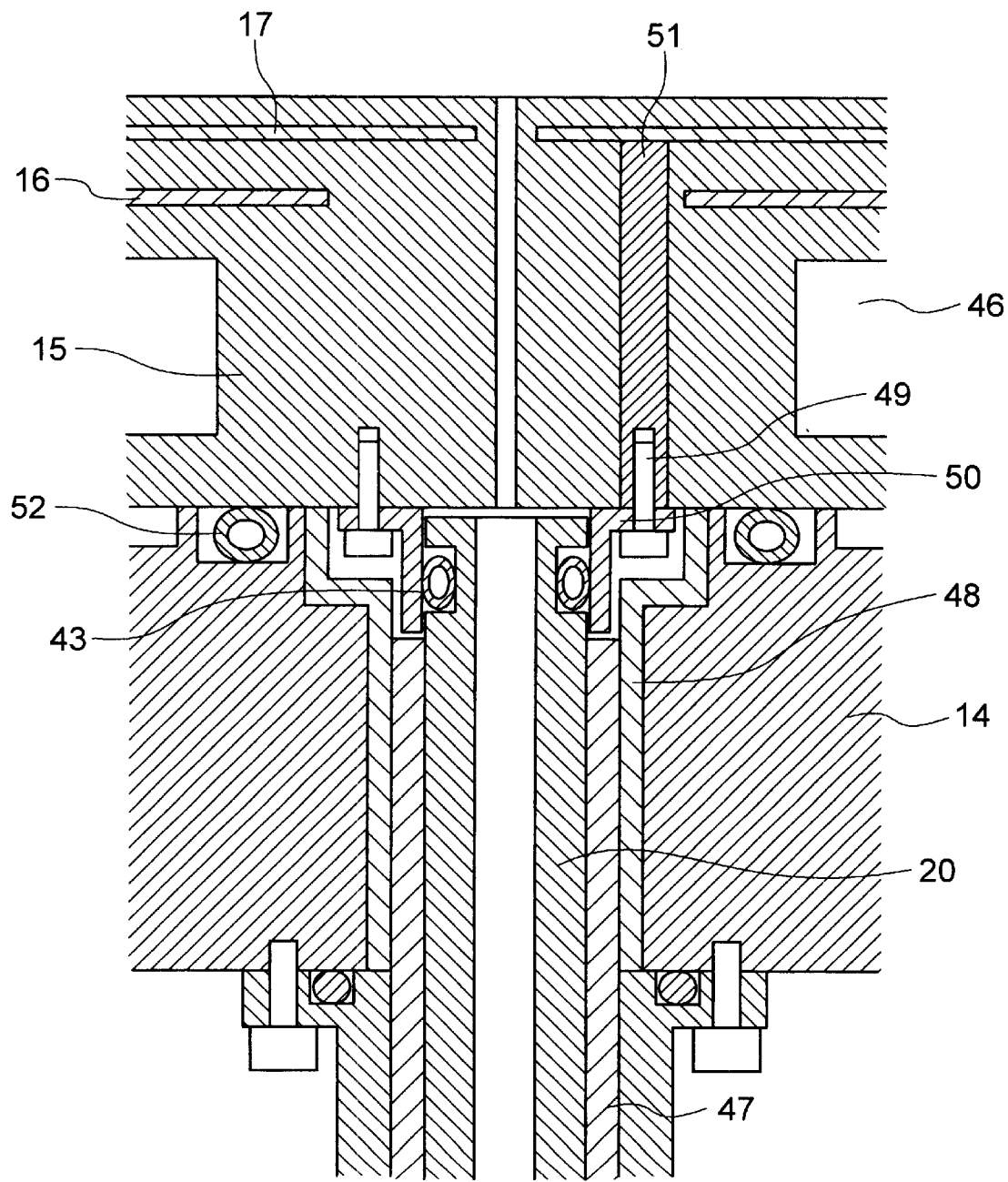
FIG. 7 is a diagram for explanation of the structure of an electrical power feed unit for the internal electrode.
Figure 8:
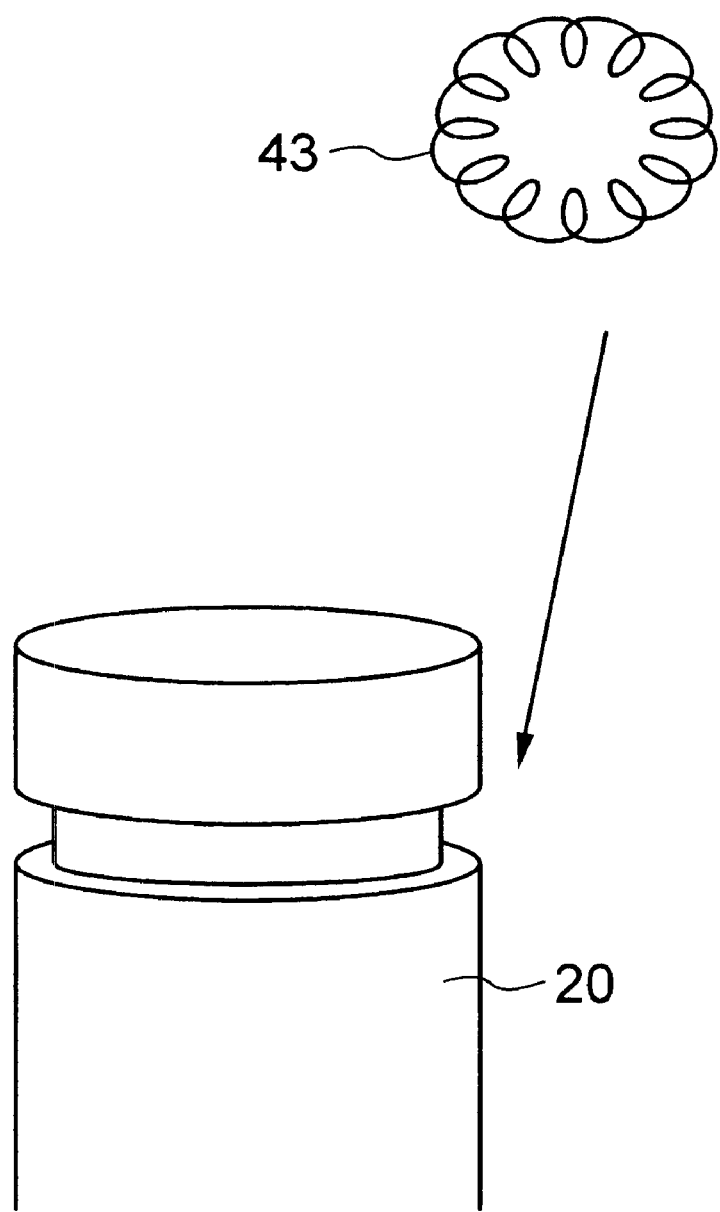
FIG. 8 is a diagram for explanation of a terminal or a shaft along with a spring member as engaged at part adjacent to the distal end thereof.

An explanation will next be given of the structures of electrical power feed units one of which is for supplying electrical power to the heater 16 and the other of which supplies power to the internal electrode 17 in the first embodiment of the instant invention, with reference to FIGS. 6 to 8. Reference is initially made to FIG. 6 for explanation of the electrical power feed unit that is operable to supply power to the heater. A through-going hole 39 is provided in the water cooling jacket 14 with an insulation-use ceramic pipe 40 inserted into this through-hole for tight engagement therewith. An electrical plug 41 is embedded in the ceramics plate 15 at a selected location corresponding to the throug-hole of the water cooling jacket and is electrically conducted to the inside heater 16. A terminal 42 is attached through the ceramic pipe in the form of being inserted into this electrical plug. At a portion near distal ends of the terminal and shaft, a spring member 43 which was formed by bending a spiral-shaped conductor as shown in FIG. 8 into a circular shape is immovably engaged and mated in order to ensure establishment of reliable contact between the terminal and the electrical plug. Numeral 44 is a seal for precluding leakage of helium gases residing within the gap 18. 45 is a wiring, which is connected to an external heater power supply. Although in this embodiment the heater power feed unit as disclosed herein consists of a single one, two power feed units are employed when the invention is reduced to practice due to a necessity of using a pair of connectors of the opposite polarities.

An explanation will next be given of the structure of the power feed unit for supplying power to the internal electrode 17 with reference to FIG. 7. A through-hole is defined at a central portion of the water cooling jacket, with a ceramic pipe 48 for insulation purposes being embedded therein. A shaft 20 and a dielectric pipe 47 made of polytetrafluoroethylene for electrical insulation use are inserted into this ceramic pipe. Provided adjacent to a distal end of the shaft is a spring member 43 for making sure electrical contact in a similar way to that of the heater power feed unit. A guide 50 that is fixed by bolts 49 to an electrical plug 51 as embedded in the ceramics plate 15 is coupled through the spring member 43 to the shaft 20. The electrical plug 51 is electrically connected to the internal electrode 17; with such a route, it is possible to apply an electrostatic chuck-use DC voltage and high-frequency bias voltage to the internal electrode. Numeral 52 denotes a seal for sealing helium gases.

In this way, since the connection structure of part being formed within the ceramics plate to supply electrical power to the internal electrode and the heater is arranged as a structure for connection from a lower side of the ceramics plate through the spring member, it is possible to readily perform any intended attachment and detachment of the ceramic plate. In addition, as it utilizes elastic deformation of the spring, the resultant electrical contact is made more reliable to thereby ensure that any contact failures will no longer occur. Additionally, since the electrical contact in improved in reliability owing to the spring's elastic deformation, an effect also is expectable of enabling the intended contact to be sustained even in cases where the ceramics plate exhibits thermal expansion at high temperatures resulting in a change in gap between it and the plug side. Thus it becomes possible to realize electrical connection over a wide temperature range.

Figure 9:
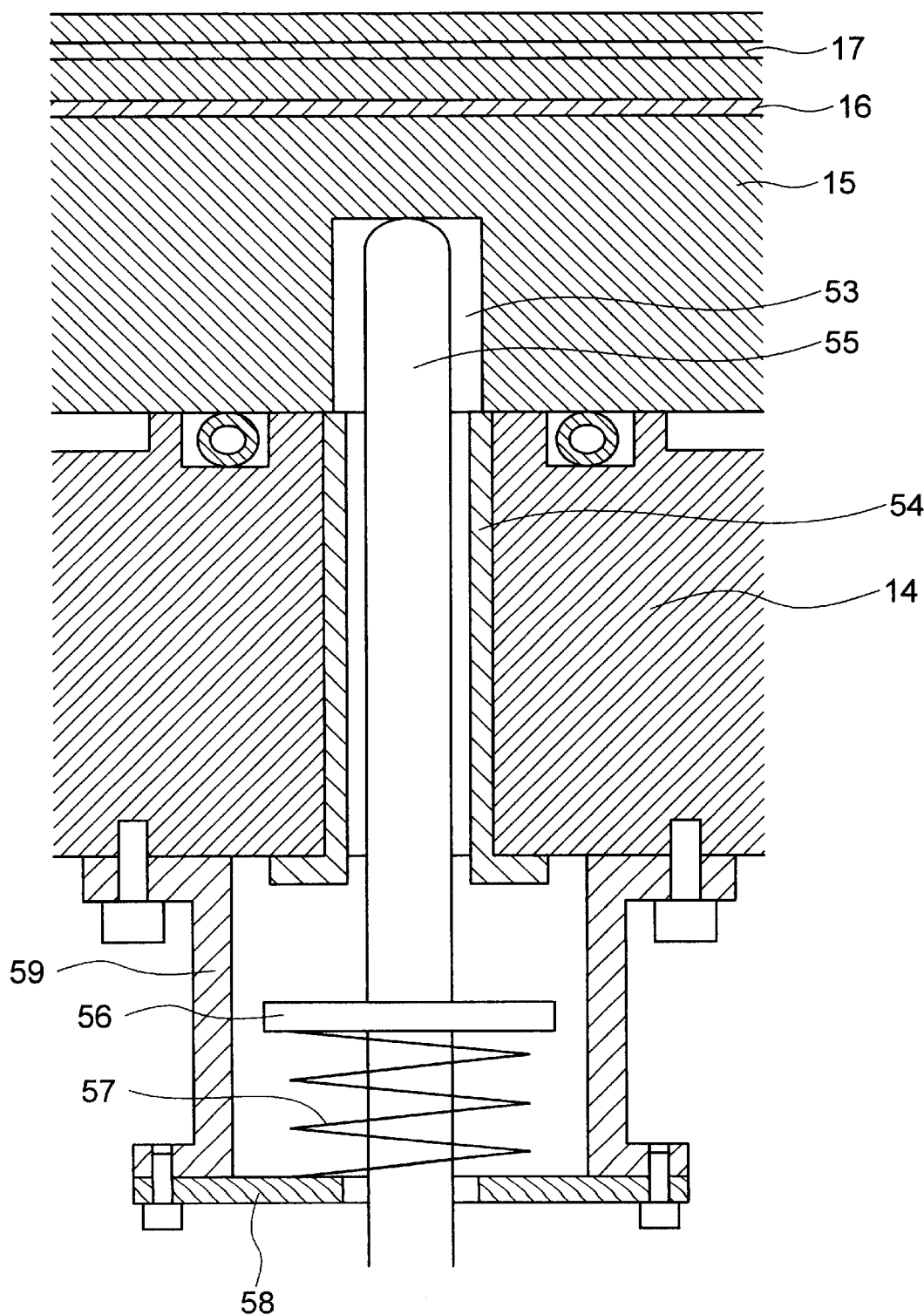
FIG. 9 is a diagram for explanation of a ceramic plate temperature measuring method.

An explanation will next be given of a method of measuring a temperature of the ceramics plate as required to determine an output of the heater and a helium gas pressure in conjunction with FIG. 9. A through-hole 54 is provided at a portion of the water cooling jacket 14, with a recess portion 53 provided in a back surface of the ceramics plate 15 corresponding to this through-hole. The recess has a diameter which is desirably set at a specified value that is equal to the diameter of the sheath thermocouple plus an allowance capable of permitting thermal expansion at a maximal use temperature of the ceramics plate. For example, suppose that the diameter of the sheath thermocouple is 3 mm, a temperature is 500° C., and the attachment position is a position of a radius of 80 mm; if this is the case, resultant expansion from a room temperature of 20° C. is represented as $(500-20) \times 5 \times 10^{-6} \times 80 = 0.19$ mm in view of the fact that the coefficient of thermal expansion of zirconia is $5 \times 10^{-6}$ (1/K). Accordingly, an allowance of 0.19 mm on one side is required in minimum—in this case, it measures 3.38 mm. However, in actual implementation, a value of 4 mm is used with an extra allowance for assembly included therein. Let a sheath thermocouple 55 be inserted in such a manner that its distal end comes into contact with a back face of this recess. If the contact state of the distal end changes then a temperature being measured also changes; to avoid this, in this embodiment, a flange 56 is provided at the thermocouple while letting a coil spring 57 be engaged at a portion of this flange with a holder 58 fixed to a support member 59 being employed to push and compress the entirety of the sheath thermocouple against the ceramics plate 15.

Accordingly, a contact pressure of the sheath thermocouple's distal end and the ceramics plate is kept constant even when the attachment state of the ceramics plate slightly changes, which in turn makes it possible to provide the intended temperature measurement method excellent in reproducibility.

Other available ceramics plate temperature measurement methods include a method that utilizes a radiation thermometer. In this case the distal end of such radiation thermometer may be designed so that it is in non-contact with the ceramics plate; thus, there is an advantage that any extra mechanism for constantly retaining the contact state is no longer required.

With the temperature measurement methodology stated above, it is impossible to directly measure a temperature of the wafer of interest. However, if a relative relationship between the ceramics plate and a wafer temperature is made evident through experimentation in advance then it is possible to estimate the wafer temperature. In addition the wafer is not required in any way to come into contact with a probe for temperature measurement use so that there is no risk of an increase in residual contaminants on the back surface thereof.

As explained above, in accordance with the arrangement of this embodiment, it is possible in the case of heating up the ceramics plate to heat up the ceramics plate at high speeds by exhausting gases from an enclosed space of the gap between the ceramic plate and the water cooling jacket to thereby create a vacuum for thermal insulation and then supplying electrical power to the heater. In addition, in the event that heat input is available from a plasma during wafer processing, it is possible to remove the heat input by letting a helium gas flow between the ceramics plate and the water cooling jacket, which in turn makes it possible to retain permit a wafer temperature constantly. Additionally the use of more than one metallic seal with a coil spring held therein in place of O-rings makes it possible to apply the intended processing to the wafer of interest over a wide temperature range covering up to a high temperature of about 500° C. Additionally, as the ceramics plate is not required to be welded to the water cooling jacket, it is possible to readily replace only the ceramics plate whenever the need arises.

It should be noted that although in this embodiment the individual seal used therein is a seal made of metal with a coil spring built therein, the present invention should not be limited only thereto; for example, a seal made of polymer material high in heat resistance temperature or the like may be used. In this case, it is lower in stiffness than metal seals so that an effect is expectable of reducing a clamping torque of bolts for fixation of the ceramics plate.

In addition, since the bolts for fixation of the ceramics plate are made of zirconia ceramics, the amount of heat releasing or "escaping" through the bolts is reduced enabling electrical power being supplied to the heater to be lowered resulting in a likewise decrease in running cost. Additionally the heat release from nearby portions of the outer periphery of the ceramics plate is lessened enabling any temperature drop-down near or around the outer periphery to decrease accordingly, which results in preclusion of lack of the uniformity of a wafer temperature distribution.

Additionally the part around the ceramics plate is specifically designed to have a structure high in radiant heat insulation effects whereby it is possible to reduce heater power being fed to the ceramics plate so that an effect is expectable of suppressing the running cost thereof. Additionally heat release due to radiation from the outer periphery of the ceramics plate may be suppressed or minimized enabling prevention of a temperature dropdown near the outer periphery of the ceramics plate resulting in a wafer in-plane temperature distribution being made uniform.

An explanation will next be given of several setup items to be set by workers in case the processing apparatus incorporating the principles of the present invention at real manufacturing sites—in particular, setup items for setting a wafer temperature (e.g. RF bias power, heater output, helium pressure on wafer back surface, gap's helium pressure).

Figure 10:
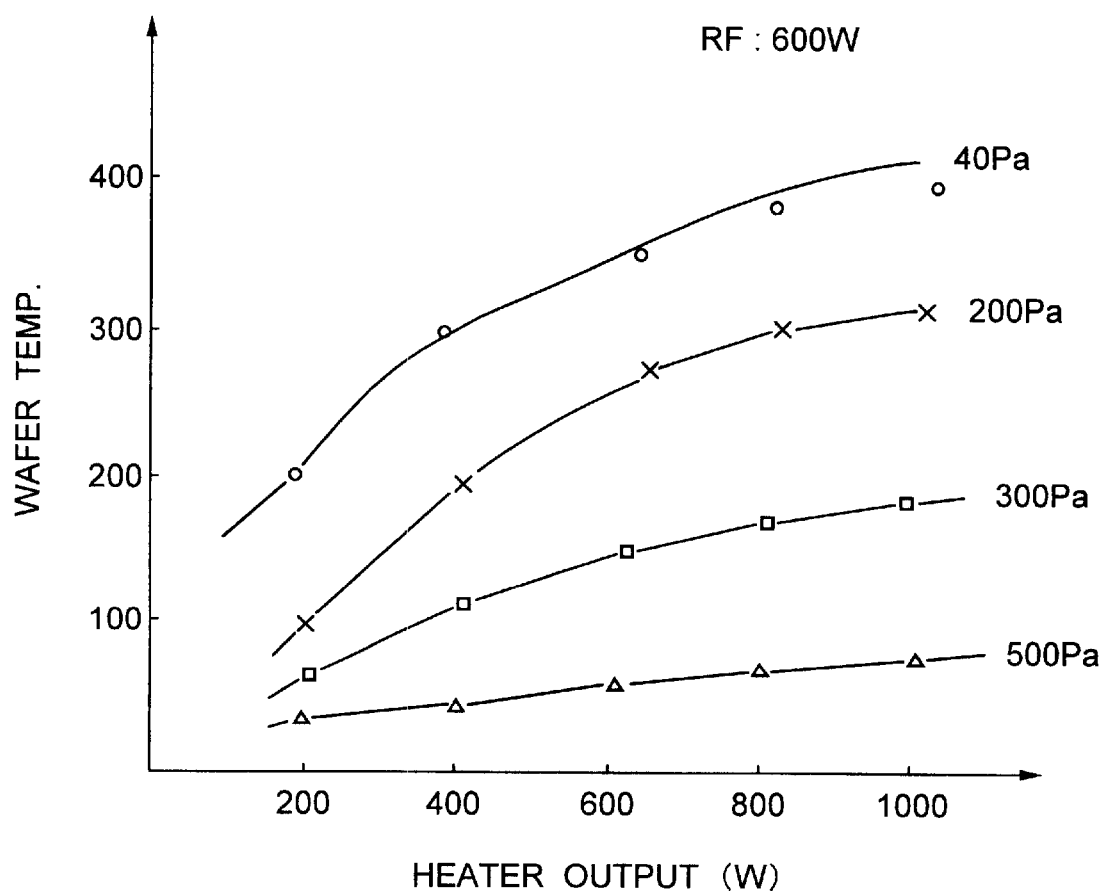
FIG. 10 is a graph showing a relationship of a heater output versus wafer temperature.

See FIG. 10, which is a graph indicative of a relationship of a heater output versus a wafer temperature in the event that the RF bias is set at 500 W in a processing apparatus embodying the invention while setting the wafer back face helium gas pressure at 1 kPa, with the gap 18's helium pressure as a parameter. This graph may be determined in advance through experimentation or alternatively calculated by computation. Such a graph is to be prepared per each bias power. Accordingly, using this graph makes it possible for workers to readily estimate or forecast a wafer temperature under certain conditions of processing to be done from now. It is also possible to adversely read therefrom which values of the heater output and the gap's helium pressure permits realization of any required wafer temperature; thus it is possible to improve the working efficiency.

Figure 11:
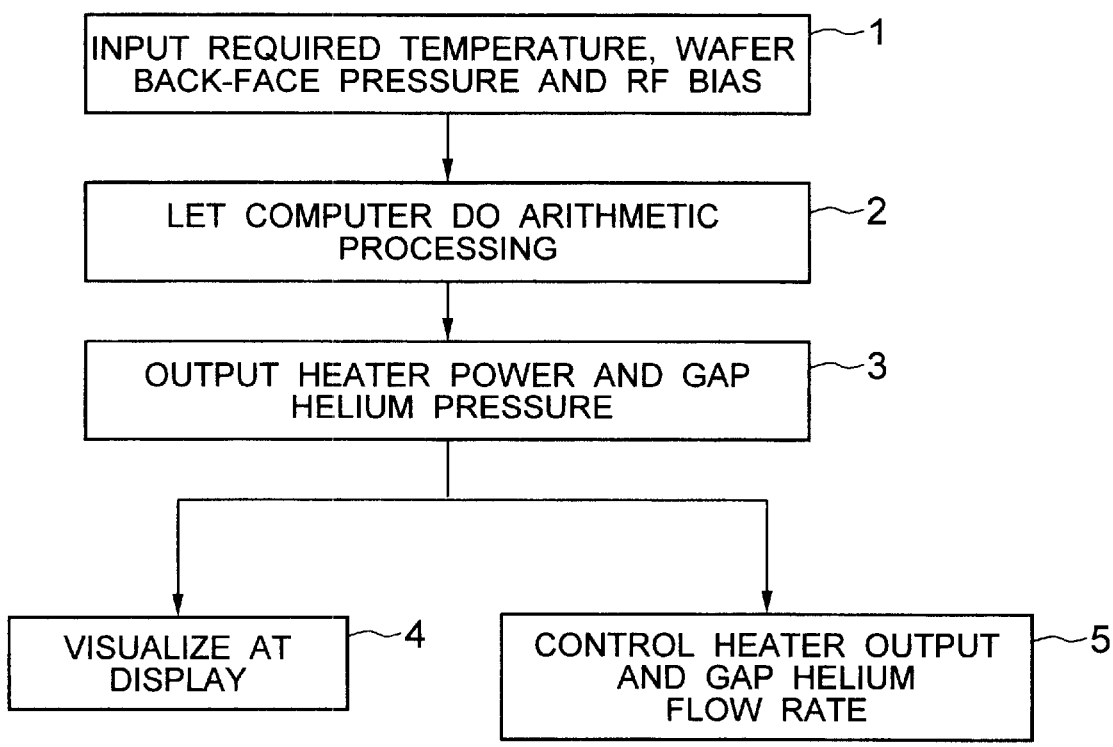
FIG. 11 is a flow diagram for explanation of an automatic wafer processing condition prediction procedure.

FIG. 11 shows an example with this procedure automated. In this example, a worker or operator is first expected to set up his or her desired processing temperature and a helium pressure on the back surface of a wafer plus RF bias power (at step 1). This information is sent to a computer, which performs arithmetic processing based on its internally prepared information shown in FIG. 10 (step 2) and then calculates the required heater output and gap's helium pressure. Results are output to a display unit in case the worker attempts to finally set them manually (step 4). Alternatively in case automatic processing is done based on the calculation results, control a heater control device and a flow rate controller 28 for flowing helium to the gap (step 5).

An advantage of these methods lies in that the conditions are readily set in the event that the worker initially implements a new process. It must be noted that although the setup items for setting the wafer temperature further include a temperature and a flow rate of refrigerant in addition to the above-noted examples, these are withdrawn from consideration because of the fact that they rarely pose any appreciable problems in cases where water is flown as the refrigerant or coolant at a rate of several liters per minute. However, if under use conditions in certain regions affecting the temperature, then it is important in a viewpoint of wafer temperature control procedure to take them into consideration as setup items in advance.

As explained above, in accordance with the first embodiment of the present invention, it is possible to perform processing with less power within a widened temperature range while making the wafer temperature uniform. It is also possible by extending this embodiment to actively change or modify the temperature distribution during processing. This will be explained below.

Figure 12:
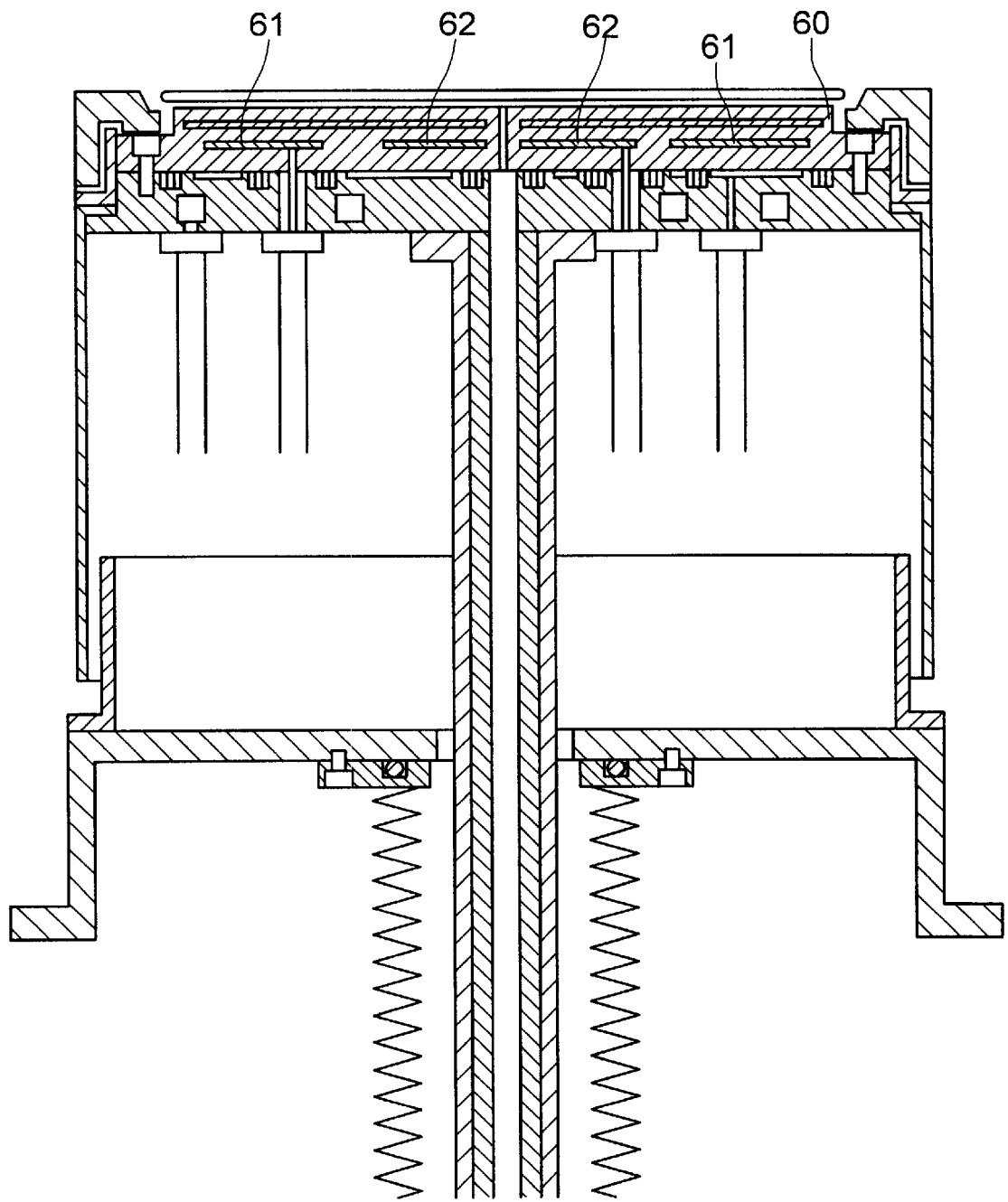
FIG. 12 is a diagram showing a second embodiment of this invention.

FIG. 12 shows a second embodiment of the invention as disclosed and claimed herein. This embodiment is arranged to have a structure in which a heater assembly being internally provided in a ceramics plate 60 consists essentially of separate or "independent" heaters: an outer periphery heater 61, and an inner periphery heater 62. In addition, although not specifically depicted in FIG. 12, two sheath thermocouples are provided at locations in a radial direction for measurement of a temperature adjacent to the inner periphery of a wafer and a temperature near the outer periphery thereof. Using these two thermometers makes it possible to control electrical power being supplied to each heater on the basis of information as to temperatures as measured thereby. Note that in FIG. 12, a pusher pin mechanism is eliminated from the illustration for simplification purposes only.

With such an arrangement, in the event that a temperature distribution is required to be generated within a wafer surface, it becomes possible to readily realize it by changing or updating electric power being supplied to each heater. Whereby, it becomes possible to obtain any desired etching characteristics.

Although in this embodiment the heater assembly is subdivided into two separate regions one of which is adjacent to the center and the other of which is near the outer periphery, it will not necessarily divided into two portions and may alternatively be designed to have different patterns or still alternatively be divided into three portions. It is the one that should be adequately determined on a case-by-case basis to realize a required wafer temperature distribution.

Figure 13:
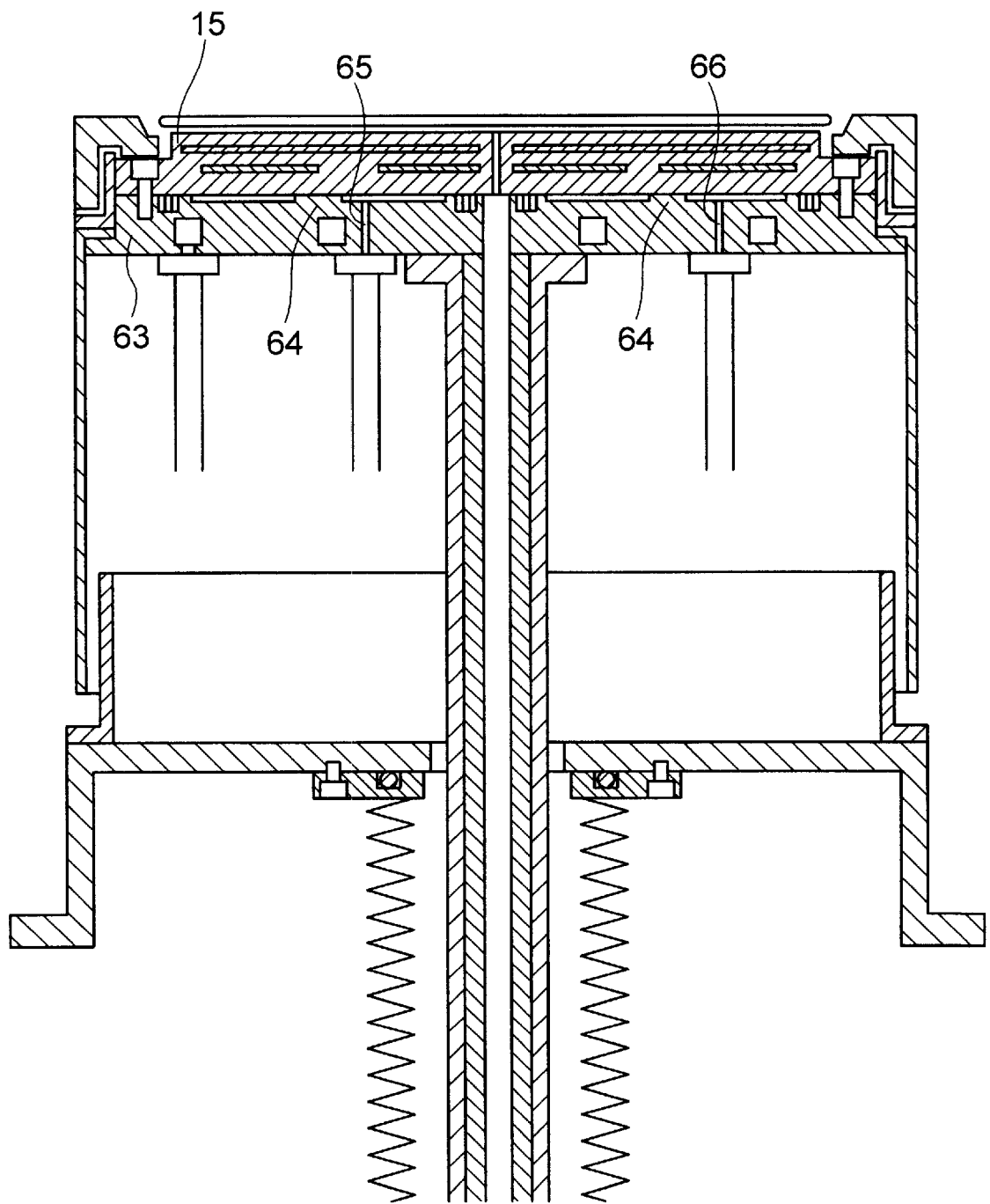
FIG. 13 is a diagram showing a third embodiment of the invention.

A third embodiment of the invention is shown in FIG. 13. In this embodiment a recess portion 64 is provided in the gap as provided between a water cooling jacket 63 and ceramics plate 15 in such a way as to permit division of an inner periphery and outer periphery while providing a mechanism for introduction and outward delivery of helium independently of the inner periphery and outer periphery. In the drawing, only an inside introduction port 65 and outside introduction port 66 are depicted with no helium exit ports shown therein. Note that the pusher pin mechanism and heater power feed unit are eliminated from the illustration for purposes of simplification only. In this arrangement, letting the inside region and outside region change in helium gas pressure makes it possible to permit thermal conductance relative to the ceramics plate to change accordingly, which in turn enables successful control of the resultant wafer temperature distribution. Although in this embodiment no specific seals are provided at the dividing recess portion, it is possible to establish a difference in pressure between the inside and the outside because the conductance is sufficiently small in value. However, if more than one seal member is provided at the recess portion where necessary, then it becomes possible to more precisely control an inside pressure and an outside pressure.

In each of the above-stated embodiments the helium gas being introduced into the space between the wafer back surface and the ceramics plate is introduced from a central portion thereof in all cases. However, this arrangement will not be necessarily employed and may be modified so that the gas is introduced into part adjacent to the wafer's outer periphery or still alternatively introduced from both the center and the outer periphery at a time. Which one of them should be used is appropriately determinable from viewpoints of apparatus design easiness and desirable wafer temperature distributions and the like on a case-by-case basis.

Optionally, when the second and third embodiments of this invention are combined together for actual reduction to practice, it becomes possible to further effectively control the temperature of a wafer being presently processed or the temperature of a wafer(s) within a lot or the temperature of a wafer between lots.

Also note that although in each embodiment stated supra the electrostatic chuck for fixation of a wafer is one that employs the so-called monopole scheme with its internal electrode being of a single polarity, the invention should not be limited only to this. More specifically the internal electrode for use with such electrostatic chuck may alternatively be the one of the type using so-called bipolar scheme having two independent electrodes. With this scheme, there is a disadvantage which follows: the resulting structure is complexed due to the necessity to make use of two separate electrodes in the interior; or alternatively, two power supply units are necessary. However, since it is possible to attract and stably hold a wafer even in the absence of a plasma therein, in other words, it is possible to introduce coolant gases onto a wafer back surface prior to start-up of the required plasma processing—there is an advantage that excellent temperature controllability is achievable.

Further note that although the plasma source of the processing apparatus of each of the above-noted embodiments is designed under an assumption that a inductively coupled plasma schemes is used, the invention should not necessarily be limited thereto. For example, it may be a plasma source of the type employing parallel planar plate schemes or alternatively UHF plasma, VHF plasma, and ECR plasma are available. Other available examples include plasma processing apparatus of the magnetron type using magnetic fields. Determining which one is selected for actual use from among these schemes is done in such a way that a certain one should be employed which matches the characteristics of actually processed material and thus is appropriately selected on a case-by-case basis.

Figure 14:
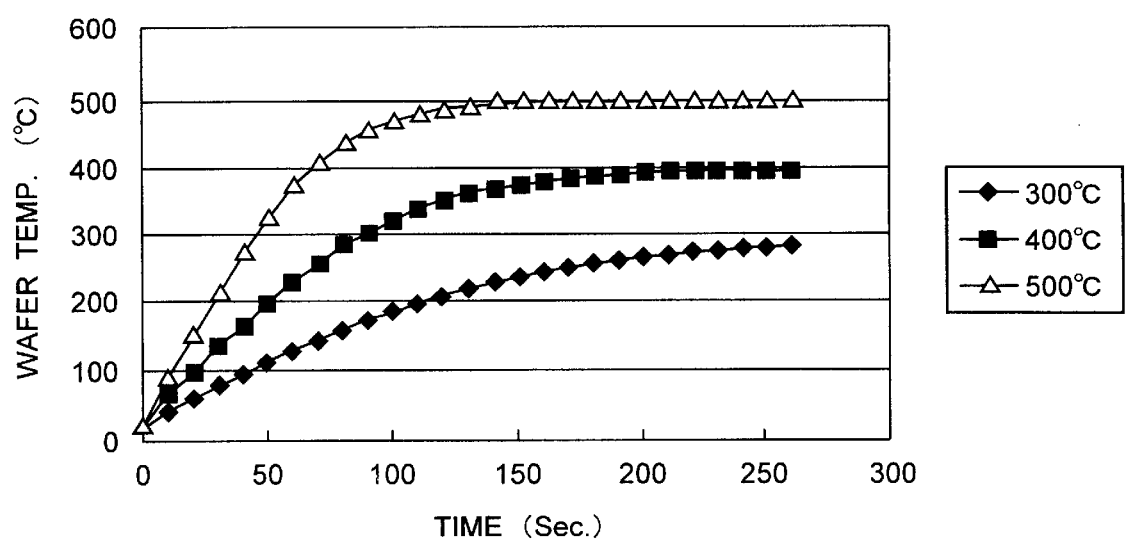
FIG. 14 is a diagram showing a fourth embodiment of the invention.

An explanation will next be given of a fourth embodiment of the invention with reference to FIGS. 14–15 below. In cases where a semiconductor wafer is processed at a high temperature such as 500° C., rapid heat-up of the semiconductor wafer can result in occurrence of accidental cracking due to application of thermal shocks. In view of this, the embodiment shown herein is arranged so that a process is introduced of pre-heating the semiconductor wafer while supporting it within a prespecified length of time period after having transferred and loaded the wafer onto the wafer stage within a processing chamber. The temperature rise characteristic of such semiconductor wafer is shown in FIG. 14 in units of wafer stage temperatures (300° C., 400° C., 500° C.). A time constant ("t" seconds) per wafer stage temperature is determinable from viewing this diagram.

Figure 15:
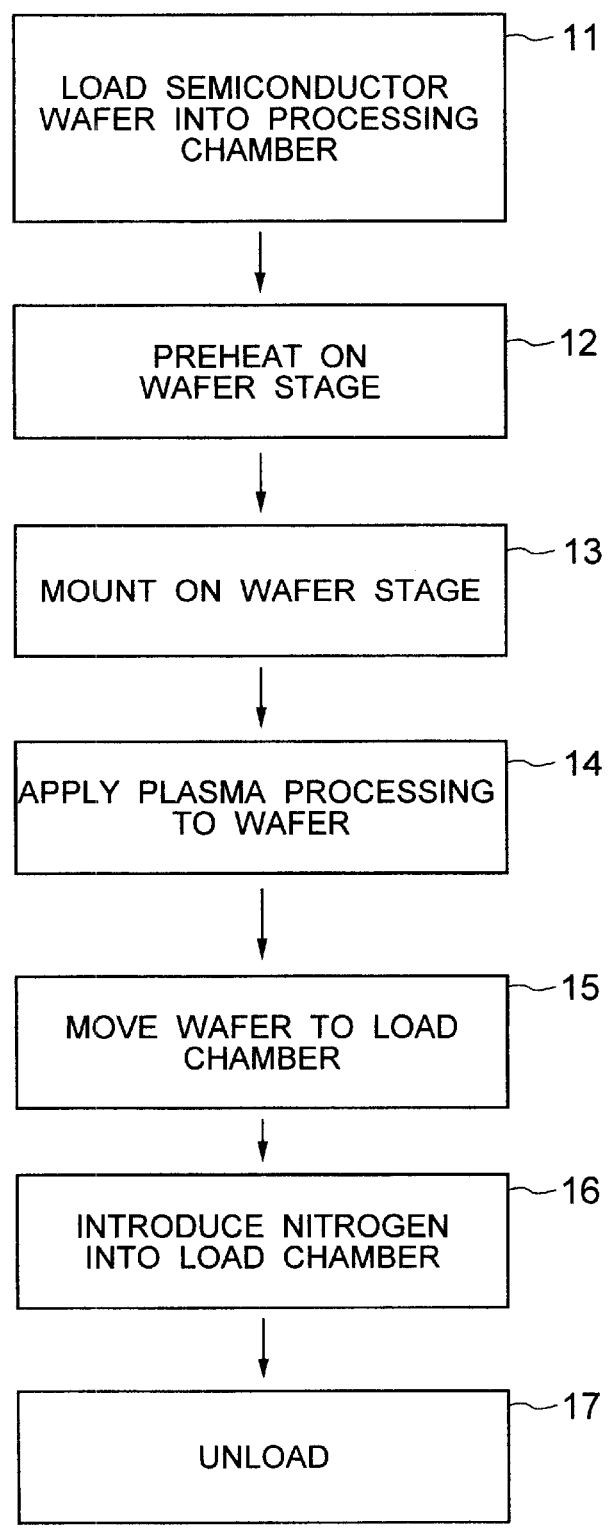
FIG. 15 is a diagram showing the fourth embodiment of the invention.

FIG. 15 is a flow chart showing a wafer transportation process. As shown herein, the wafer transfer process includes the steps of loading a semiconductor wafer into a processing chamber (step 11), performing pre-heating for a predetermined length of time period which is different per processing process (for example, the time period of the above-noted time constant) while immovably holding the loaded semiconductor wafer on a wafer stage (step 12), and mounting the wafer on the wafer stage after completion of the preheating (step 13). Then, apply plasma processing to the wafer (step 14); after termination of the processing, send the wafer toward a transfer chamber (step 15). Next, introduce a nitrogen gas into the transfer chamber to thereby cool down the wafer (step 16); after having cooled it to a prespecified temperature, unload the wafer.

In this way, with this embodiment, the preheat time of a predetermined duration is provided. Although this process increases the wafer processing time per single piece, it is possible to prevent occurrence of unwanted cracking of wafers due to thermal shocks. Consequently with the processing method of this embodiment, it is finally possible to expect an effect of improving the apparatus in working efficiency.

On the other hand, in case the wafer is to be unloaded and transferred outwardly, a process is required of reducing the wafer's temperature after having moved the semiconductor wafer from the processing chamber to a buffer room (transfer chamber). In view of this, with this embodiment, after having moved it to the buffer room, introduce a nitrogen gas in the state that the wafer is not yet taken out and then let the heat energy move to a chamber of the buffer room to thereby cool down the wafer. Using this method makes it possible to readily cool the wafer while retaining increased safety even when operators touch it accidentally.

Although the embodiments discussed above are arranged to have a specific structure with the internal electrode and heater built in the ceramics plate, other wafer stages adaptable for high-temperature etching treatment will be explained below.

Figure 16:
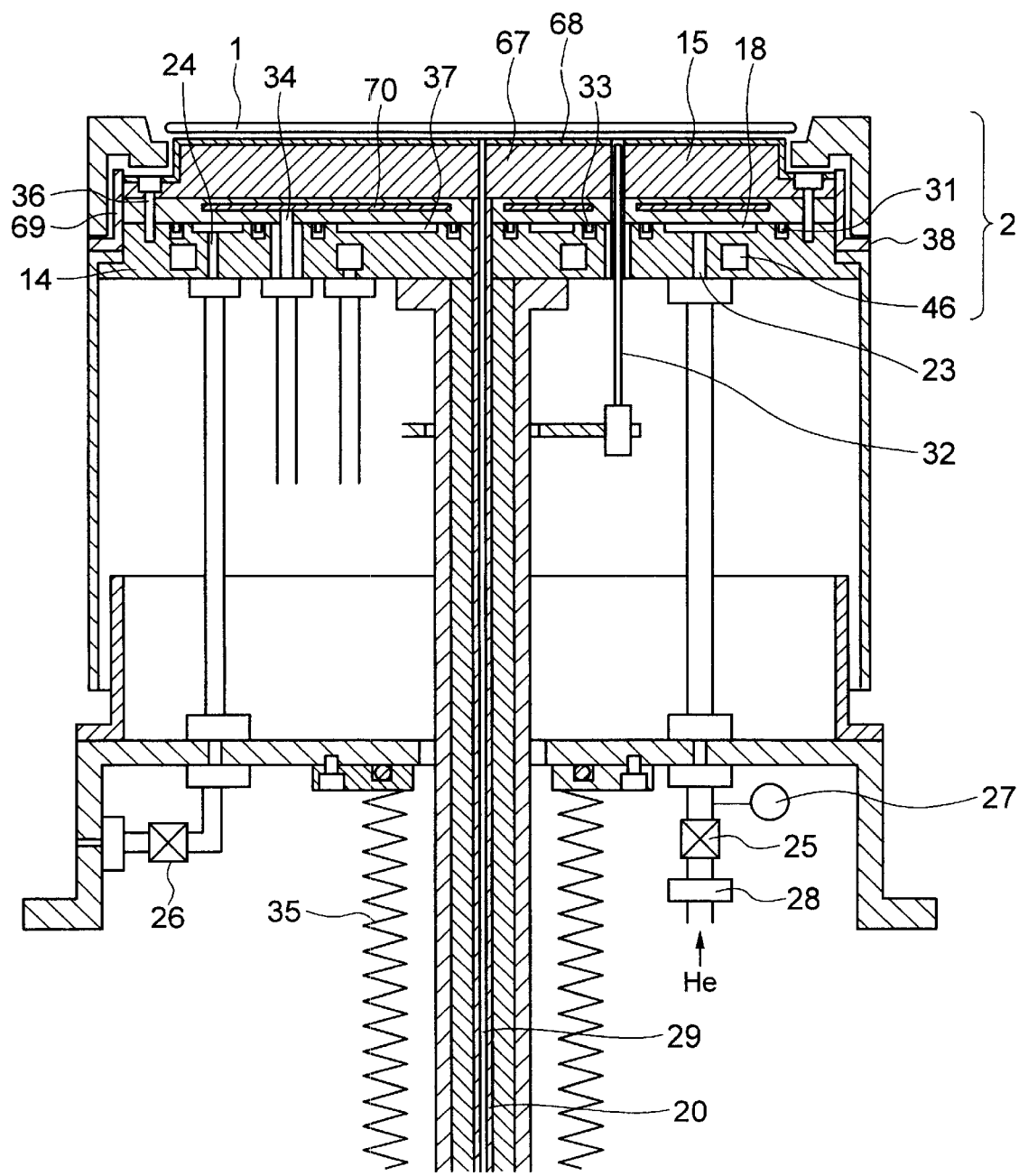
FIG. 16 is a diagram showing a fifth embodiment of the invention.

A fifth embodiment of the invention is shown in FIG. 16. In this embodiment a ceramic heater 69 containing therein a heater wiring 70 and a structure with a sprayed film 68 of ceramics provided on a surface of an aluminum base material 67 are integrated together by brazing techniques, which structure is fixed to the water cooling jacket 14 using zirconia bolts 36. In this example the sprayed film 68 functions as a dielectric film for use in the electrostatic chuck. Supplying electrical power to the aluminum base material is performed by a shaft 20, wherein a coil spring-like spring member is used for an electrical contact portion between the aluminum base material and the shaft in a similar way to that in the first embodiment, thus enabling usage within a wide temperature range. Accordingly, by applying a DC voltage and RF bias voltage through the shaft in a similar way to the first embodiment, it is possible to achieve attraction and fixation of the wafer and apply thereto the RF (high-frequency) bias. Heat transfer between the ceramics heater and the water cooling jacket is done by introduction of a helium gas into a gap 18 in a similar way to that in the first embodiment, wherein the seal for suppression of leakage into the processing chamber is a metallic seal with a built-in structure having elasticity therein in a similar way to the first embodiment. In addition, a radiant heat insulation material 38 is provided at outer peripheries of the aluminum base material and the ceramics heater for preventing outward release or escape of the heat energy via radiation. With such an arrangement, similar effects to those of the first embodiment are expectable; in addition thereto, an effect is obtainable of enabling fabrication of the dielectric film for use in the electrostatic chuck using spray methods that are inherently low in production costs.

Figure 17:
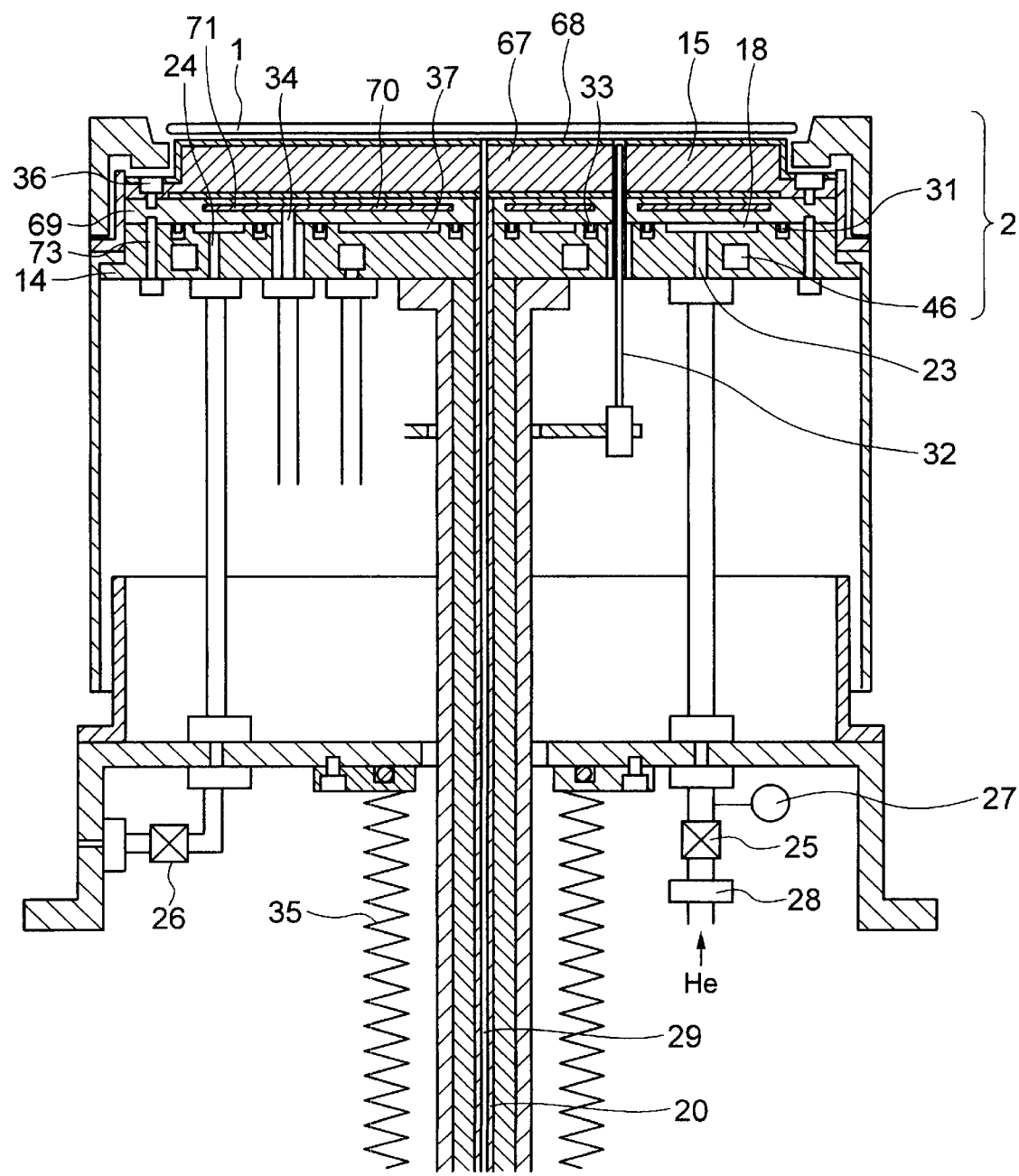
FIG. 17 is a diagram showing a sixth embodiment of the invention.

A sixth embodiment of the invention is shown in FIG. 17. In this embodiment the aluminum base material 67 and the ceramics heater 69 are fixed by zirconia ceramic bolts 36 with an aluminum plate 71 interposed therebetween. This aluminum plate 71 is used to improve the thermal contact between the aluminum base material 67 and ceramic heater 69. Thus, it will not necessarily be made of aluminum and may alternatively be made of any available materials which serve to improve the thermal conduction, such as other metals and heat conductive grease or the like. The ceramic heater 69 is fixed to the water cooling jacket 14 by more than one ceramics bolt 73. The remaining arrangement is such that the techniques of the first embodiment are applied in a similar way to that of the fifth embodiment. Consequently, with such an arrangement, similar effects to those of the first embodiment are expectable; in addition thereto, the dielectric film for use in the electrostatic chuck is manufacturable by spray methods low in production costs while simultaneously permitting easy replacement of only the aluminum base material in the event of replacement of the electrostatic chuck due to the fact that the aluminum base material alone is readily detachable, resulting in a decrease in cost and an increase in maintenance properties.

As apparent from the foregoing, in accordance with each embodiment of the present invention, it is possible to maintain the wafer of interest with a uniform temperature distribution within a wide range covering from low to high temperatures while suppressing or minimizing any possible temperature variations during processing. Thus it becomes possible to perform etch processing even with respect to nonvolatile materials that are inherently incapable of being etched by presently available standard processes.

In addition, it becomes possible to actively control the temperature distribution of a wafer being processed within a wide temperature range of from low to high temperatures. It is possible to provide a processing method without risks of cracking due to thermal shocks in the case of heating up a wafer up to high temperatures. Further, it is possible to provide a processing method with increased safety even in cases where workers touch a wafer of high temperatures while the wafer is being unloaded for outward transportation.

As has been explained above, according to the present invention, a wafer stage is provided which is capable of uniformly maintaining the temperature distribution of a wafer within a widened temperature range. It is also possible to provide a wafer processing method without suffering from risks of giving temperature change-induced obstruction to wafers.

It should be further understood by those skilled in the art that the foregoing description has been made on embodiments of the invention and that various changes and modifications may be made in the invention without departing from the spirit of the invention and the scope of the appended claims.

What is claimed is:

1. A wafer stage for use in a wafer processing apparatus comprising a liquid cooling jacket with a built-in coolant liquid circulation path and a ceramic plate as attached onto said liquid cooling jacket and having therein a heater and an electrode for an electrostatic chuck, said wafer stage being for performing wafer processing while letting a wafer be mounted on the ceramic plate, wherein said liquid cooling jacket permits attachment of said ceramic plate through a gap for circulation of a coolant gas as formed over the liquid cooling jacket while disposing between said liquid cooling jacket and said ceramic plate a heat resistant seal material containing therein an elastic body for sealing said coolant gas, and wherein said ceramic plate is attached to the liquid cooling jacket by more than one adhesive clamping element made of zirconia ceramic material.

2. A wafer stage for use in a wafer processing apparatus comprising a liquid cooling jacket with a built-in coolant liquid circulation path and a ceramic plate as attached onto said liquid cooling jacket and having therein a heater and an electrode for an electrostatic chuck, said wafer stage being for performing wafer processing while letting a wafer be mounted on the ceramic plate, wherein said liquid cooling jacket permits attachment of said ceramic plate through a gap for circulation of a coolant gas as formed over the liquid cooling jacket while disposing between said liquid cooling jacket and said ceramic plate a heat resistant seal material containing therein an elastic body for sealing said coolant gas, and wherein any one of said heater and the electrode for electrostatic chuck comprises a cylindrical plug as built in the ceramic plate and a stem-like terminal with a spring member insertable into the cylindrical member being engaged therewith.

* * * * *